(12) United States Patent
Schlaeppi et al.

(10) Patent No.: US 11,499,221 B2
(45) Date of Patent: Nov. 15, 2022

(54) FLEXIBLE SUBSTRATE DEPOSITION SYSTEM

(71) Applicants: FLISOM AG, Duebenforf (CH); Lorenzo Parrini, Duebendorf (CH)

(72) Inventors: Bernhard Schlaeppi, Zurich (CH); Michael Akermann, Zurich (CH)

(73) Assignee: FLISOM AG, Niederhasli (CH)

( * ) Notice: Subject to any disclaimer, the term of this patent is extended or adjusted under 35 U.S.C. 154(b) by 707 days.

(21) Appl. No.: 16/325,350

(22) PCT Filed: Aug. 9, 2017

(86) PCT No.: PCT/IB2017/000957
§ 371 (c)(1),
(2) Date: Feb. 13, 2019

(87) PCT Pub. No.: WO2018/033786
PCT Pub. Date: Feb. 22, 2018

(65) Prior Publication Data
US 2019/0203348 A1    Jul. 4, 2019

Related U.S. Application Data

(60) Provisional application No. 62/375,747, filed on Aug. 16, 2016.

(51) Int. Cl.
*C23C 14/56* (2006.01)
*C23C 14/54* (2006.01)
(Continued)

(52) U.S. Cl.
CPC .......... *C23C 14/562* (2013.01); *B05C 5/0245* (2013.01); *C23C 14/24* (2013.01);
(Continued)

(58) Field of Classification Search
USPC .... 118/723 R, 671–673, 620–640, 718, 726, 118/725, 723 VE
See application file for complete search history.

(56) References Cited

U.S. PATENT DOCUMENTS 5,704,980 A * 1/1998 Misiano .............. C23C 14/0042
118/708
7,666,490 B1 * 2/2010 Iseki ..................... C23C 14/545
428/156
(Continued)

FOREIGN PATENT DOCUMENTS

KR     20150127008 A    11/2015

OTHER PUBLICATIONS

International Search Report and Written Opinion for Application No. PCT/IB2017/000957 dated Nov. 29, 2017.

*Primary Examiner* — Yewebdar T Tadesse
(74) *Attorney, Agent, or Firm* — Patterson + Sheridan, LLP

(57) ABSTRACT

A deposition system is provided for guiding a flexible substrate along a deposition path. The deposition system includes a payout hub for unwinding the flexible substrate; a pickup hub for winding the flexible substrate; one or more evaporation sources (300); one or more electrodes (510) spaced apart from the one or more evaporation sources in a first direction; one or more measurement devices (550); and a controller (601) configured to adjust one or more voltages provided to the one more electrodes.

14 Claims, 8 Drawing Sheets

(51) Int. Cl.
 *C23C 14/50* (2006.01)
 *B05C 5/02* (2006.01)
 *C23C 14/24* (2006.01)

(52) U.S. Cl.
 CPC ............ *C23C 14/50* (2013.01); *C23C 14/548* (2013.01); *C23C 14/568* (2013.01)

(56) References Cited

U.S. PATENT DOCUMENTS

| | | | |
|---|---|---|---|
| 2008/0199629 A1* | 8/2008 | Simor | D06M 10/10 427/488 |
| 2009/0255467 A1 | 10/2009 | Britt et al. | |
| 2010/0304155 A1* | 12/2010 | Fujinami | C23C 16/509 428/446 |
| 2011/0139067 A1 | 6/2011 | Gottsman et al. | |
| 2015/0079271 A1* | 3/2015 | Hermanns | C23C 16/4401 427/8 |
| 2015/0147471 A1* | 5/2015 | Yamada | C23C 14/562 427/248.1 |

* cited by examiner

FLEXIBLE SUBSTRATE DEPOSITION SYSTEM

CROSS-REFERENCE TO RELATED APPLICATIONS

This application is a national stage application under 35 U.S.C. 371 of International Application No. PCT/IB2017/000957, filed Aug. 9, 2017, which claims benefit of U.S. Provisional Application No. 62/375,747, filed Aug. 16, 2016. The above applications are all incorporated by reference herein.

BACKGROUND

Field

Embodiments of the present disclosure generally relate to a deposition system for conveying a flexible substrate in a processing environment and more particularly for a deposition system for conveying a flexible substrate past one or more evaporation sources for depositing one or more materials on the substrate.

Description of the Related Art

A roll-to-roll deposition process is commonly used to form thin film solar cells, batteries and other commercial electronic devices, such as CIGS (copper-indium-gallium-(di)selenide) solar cell devices. During processing, equipment in a deposition system is generally used to unwind a flexible substrate (also referred to as the "web") from a payout roll, guide the flexible substrate through a processing region, and then rewind the flexible substrate on a pickup roll. In one example, a series of evaporation sources are used to deposit the different elements of the CIGS absorber layer of a solar cell in the processing region. Typically, these types of deposition processes are performed within a vacuum chamber.

The edges of the flexible substrate can be supported by clamps to help transport the flexible substrate past the evaporation sources. Although the clamps help to maintain the flexible substrate at given height above the evaporation sources, the flexible substrate can still sag (e.g., sagging in a vertical direction) between the clamps along the edges and between the edges. This sag can affect the uniformity of the deposited layer(s) on the flexible substrate. Furthermore, this sag can prevent accurate measurements of the composition and thickness of the deposited layer(s) on the flexible substrate.

Therefore, there is a need for a deposition system that solves one or more of the problems described above.

SUMMARY

Embodiments of the present disclosure generally relate to a deposition system for conveying a flexible substrate in a processing environment and more particularly for a deposition system for conveying a flexible substrate past one or more evaporation sources for depositing one or more materials on the substrate.

In one embodiment, a deposition system is provided for guiding a flexible substrate along a deposition path. The deposition system includes a payout hub for unwinding the flexible substrate; a pickup hub for winding the flexible substrate; one or more evaporation sources; one or more electrodes spaced apart from the one or more evaporation sources in a first direction; one or more measurement devices; and a controller configured to adjust one or more voltages provided to the one more electrodes.

In another embodiment, a method of depositing a film on a flexible substrate is provided. The method includes conveying the flexible substrate between a payout hub and a pickup hub; applying an initial voltage to a first electrode spaced apart from the flexible substrate in a first direction, wherein the flexible substrate is disposed between a first evaporation source and the first electrode; directing deposition material from the first evaporation source towards the flexible substrate to deposit a first layer onto a first surface of the flexible substrate; and measuring a property of the first layer deposited on the flexible substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following, reference is made to embodiments. However, it should be understood that the disclosure is not limited to specific described embodiments. Instead, any combination of the following features and elements, whether related to different embodiments or not, is contemplated to implement and practice the claimed subject matter. Furthermore, although embodiments described herein may achieve advantages over other possible solutions and/or over the prior art, whether or not a particular advantage is achieved by a given embodiment is not limiting of the claimed subject matter. Thus, the following aspects, features, embodiments and advantages are merely illustrative and are not considered elements or limitations of the appended claims except where explicitly recited in a claim(s).

Embodiments of the present disclosure generally relate to a deposition system for conveying a flexible substrate and more particularly for a deposition system for conveying a flexible substrate past one or more evaporation sources for depositing one or more materials on the substrate. Embodiments of the disclosure may generally provide one or more electrodes for chucking the flexible substrate towards the one or more electrodes, so that the flexible substrate is located at a uniform and consistent distance from the evaporation sources and from one or more measurement devices used to determine the composition and/or thickness of the layer(s) deposited onto the flexible substrate.

Figure 1A:
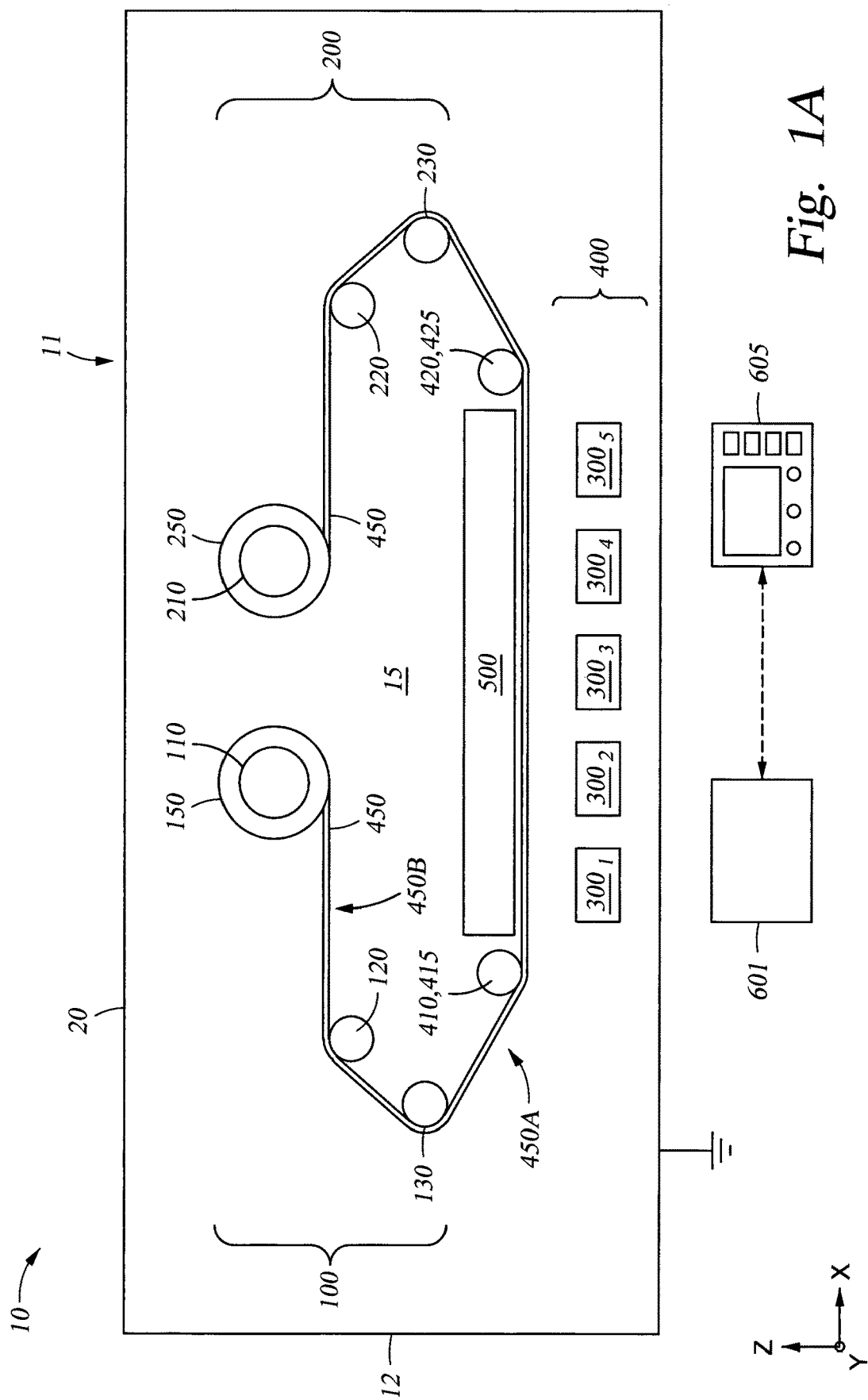
FIG. 1A is a side cross-sectional view of a deposition system, according to one embodiment.

FIG. 1A is a side cross-sectional view of a deposition system 10, according to one embodiment. The deposition system 10 is a roll-to-roll system for depositing material layers onto a flexible substrate 450. In some embodiments, the deposition system 10 can be a vacuum deposition system used to perform depositions on the flexible substrate 450 in a vacuum environment. In other embodiments, the deposition system 10 may also be used to process a substrate 450 at other pressures besides vacuum pressures. Although the remainder of the disclosure is largely described as a deposition system, aspects of the disclosure may also be applied to equipment used to transport, convey, or translate the substrate 450 in the absence of a deposition, such as a substrate transport system that transports and/or processes (e.g., scribes or thermal processes) the substrate 450 as the substrate 450 passes from a payout hub 110 to a pickup hub 210. The flexible substrate 450 can be, for example, a web or foil of flexible polyimide or stainless steel material. The deposition system 10 includes a deposition assembly 11, a controller 601, and an operator station 605.

The controller 601 is generally used to facilitate the control and automation of the components within the equipment included in the deposition assembly 11 as well as related equipment connected to or associated with the deposition assembly 11. In one embodiment, the deposition assembly 11 is a vacuum deposition assembly configured to process the substrate 450 in a vacuum environment. The operator station 605 can provide status of the deposition assembly 11 to a user as well as allow the user to control the processes executed with the equipment in the deposition system 10, such as allowing the user to start and stop the transport of the flexible substrate 450 through the deposition assembly 11.

The controller 601 can be, for example, a computer, a programmable logic controller, or an embedded controller. The controller 601 typically includes a central processing unit (CPU) (not shown), memory (not shown), and support circuits for inputs and outputs (I/O) (not shown). The CPU may be one of any form of computer processors that are used in industrial settings for controlling various system functions, substrate movement, chamber processes, and control support hardware (e.g., sensors, motors, evaporation sources, heaters, etc.), and monitor the processes performed in the system (e.g., substrate tension, I/O signals, etc.). The memory is connected to the CPU, and may be one or more of a readily available non-volatile memory, such as random access memory (RAM), flash memory, read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

A program (or computer instructions) readable by the controller 601 determines which tasks are performable on the substrate 450 in the deposition assembly 11. Preferably, the program is software readable by the controller 601 that includes code to perform tasks relating to monitoring, execution and control of the movement, support, and/or positioning of the substrate 450 along with the various process tasks and various sequences being performed by the controller 601 (e.g., starting up or shutting down the deposition assembly 11). The operator station 605 may include a wired or wireless computing device that contains various user input devices, such as a touch screen display, keyboard and buttons, and an output device, such as a GUI display, LED lights or other similar device.

The deposition assembly 11 includes a deposition chamber 20 (e.g., a vacuum chamber) including one or more walls 12 for enclosing an interior 15 of the deposition chamber 20. Inside the deposition chamber 20, the deposition assembly 11 includes a payout section 100 for unwinding the flexible substrate 450 from a payout roll 150, a processing section 400 for performing a deposition on the flexible substrate 450, and a pickup section 200 for rewinding the flexible substrate 450 onto a pickup roll 250 after processing. The processing section 400 includes one or more evaporation sources 300 for depositing one or more materials on the flexible substrate 450 and a first assembly 500. The first assembly 500 includes one or more electrodes (not shown) for chucking the flexible substrate 450 towards the first assembly 500, so that the flexible substrate 450 is located at a uniform and consistent distance from the evaporation sources 300 and from one or more sensors used to determine a property of the layer(s), such as the composition, crystal structure or thickness of the layer(s) deposited on the flexible substrate 450. The first assembly 500 is described in further detail in reference to FIGS. 1B and 1C.

The deposition system 10 guides the flexible substrate 450 along a deposition path from the payout roll 150 in the payout section 100, through the processing section 400, and to the pickup roll 250 in the pickup section 200. In one example, the payout roll 150 is a roll of the unprocessed flexible substrate 450, such as a roll of polyimide foil or a roll of polyimide foil coated by one or more layers that include one or more metals, such as molybdenum. The payout roll 150 is placed on a payout hub 110 before processing of the flexible substrate 450 begins. The payout hub 110 can rotate to unwind the flexible substrate 450 from the payout roll 150. The payout roll 150 decreases in diameter as the flexible substrate 450 is unwound from the payout roll 150. The pickup roll 250 is a roll that includes the processed flexible substrate 450, for example, after the one or more evaporation sources 300 have deposited one or more materials on the flexible substrate 450. The pickup roll 250 is formed around a pickup hub 210. The pickup hub 210 can rotate to wind the flexible substrate 450 onto the pickup roll 250. The pickup roll 250 increases in diameter as the flexible substrate 450 is wound onto the pickup roll 250.

The payout section 100 can include a first payout roller 120 and a second payout roller 130 to assist in guiding the flexible substrate 450 to the processing section 400 by adjustment of their relative positions or orientations to each other and/or to the payout hub 110. The relative positions or orientations of the first payout roller 120 and the second payout roller 130 may be accomplished by use of an actuator (not shown) that is coupled to the supporting elements (not shown) of each of these assemblies. The first payout roller 120 is closer to the payout hub 110 than the second payout roller 130 is to the payout hub 110. The actuators coupled to the first payout roller 120 and the second payout roller 130 can also assist in providing the proper tension to the flexible substrate 450 as the flexible substrate 450 is guided into the processing section 400. One or more payout tension sensors (not shown) can be connected to the controller 601 to monitor the tension of the flexible substrate 450 as the flexible substrate 450 is guided into the processing section 400.

The processing section 400 can include one or more payout tractors 410, 415 and, optionally, one or more pickup tractors 420, 425 to assist in conveying the flexible substrate 450 through the processing section 400. The payout tractors 410, 415 are positioned closer to the payout section 100 than the pickup tractors 420, 425 are to the payout section 100. The payout tractors 410, 415 include a first payout tractor 410 and, optionally, a second payout tractor 415. The payout tractors 410, 415 can be positioned to engage opposing sides (i.e., the opposing sides in the Y-direction of FIG. 1A) of the flexible substrate 450. For example, the first payout tractor 410 may be positioned to engage the left side of the flexible substrate 450, and the second payout tractor 415 may be positioned to engage the right side of the flexible substrate 450 when looking down (i.e., –Z-direction) on a given length of the flexible substrate 450.

The pickup tractors 420, 425 are positioned closer to the pickup section 200 than the payout tractors 410, 415 are to the pickup section 200. The pair of pickup tractors 420, 425 include a first pickup tractor 420 and a second pickup tractor 425. The pickup tractors 420, 425 can be positioned to engage opposing sides (i.e., the opposing sides in the Y-direction of FIG. 1A) of the flexible substrate 450. For example, the first pickup tractor 420 may be positioned to engage the left side of the flexible substrate 450, and the second pickup tractor 425 may be positioned to engage the right side of the flexible substrate 450 when looking down (i.e., –Z-direction) on a given length of the flexible substrate 450.

The processing section 400 further includes the one or more evaporation sources 300 and the first assembly 500. In this embodiment, the one or more evaporation sources 300 include five evaporation sources $300_1$-$300_5$. These evaporation sources 300 can heat material inside the evaporation sources 300 causing the material to evaporate. The evaporated material can then be directed towards the flexible substrate 450 as the flexible substrate 450 is conveyed past the one or more evaporation sources 300. Evaporation sources that are used to deposit metals (e.g., copper (Cu), indium (In), gallium (Ga), selenium (Se)) and/or dielectric materials are typically operated at temperatures that exceed 1000° C. The heat from the evaporation sources 300 can cause other equipment (e.g., structural supports, sensors, etc.) in the deposition assembly 11 and the flexible substrate 450 to heat up and expand. In some cases, this expansion can cause the flexible substrate 450 to become wrinkled due to a created difference in tension across the transfer direction length (X-direction) and/or lateral direction length (i.e., Y-direction). This misalignment and tendency of the flexible substrate 450 to wrinkle can be corrected in the pickup section 200 as described below in reference to FIG. 1C. The one or more electrodes in the first assembly 500 described below can also be used to reduce the occurrence of these wrinkles.

A front side 450A of the flexible substrate 450 may face the one or more evaporation sources 300. In one embodiment, the one or more evaporation sources 300 include an evaporation source 300 for each one of the elements included in a CIGS layer of a solar cell device. The evaporated material from the one or more evaporation sources 300 can deposit on the front side 450A of the flexible substrate 450. A back side 450B of the flexible substrate 450 may face the first assembly 500.

The pickup section 200 can include a first pickup roller 220 and a second pickup roller 230 to assist in guiding the flexible substrate 450 from the processing section 400 by adjustment of their relative positions or orientations to the pickup hub 210. The relative positions or orientations of the first pickup roller 220 and the second pickup roller 230 may be accomplished by use of an actuator (not shown) that is coupled to the supporting elements (not shown) of each of these assemblies. The first pickup roller 220 is closer to the pickup hub 210 than the second pickup roller 230 is to the pickup hub 210. The actuators coupled to the first pickup roller 220 and the second pickup roller 230 can also assist in providing proper tension to the flexible substrate 450 as the flexible substrate 450 is conveyed to the pickup hub 210. One or more tension sensors (not shown) can be connected to the controller 601 to monitor the tension of the flexible substrate 450 as the flexible substrate 450 is conveyed into the pickup section 200.

Figure 1B:
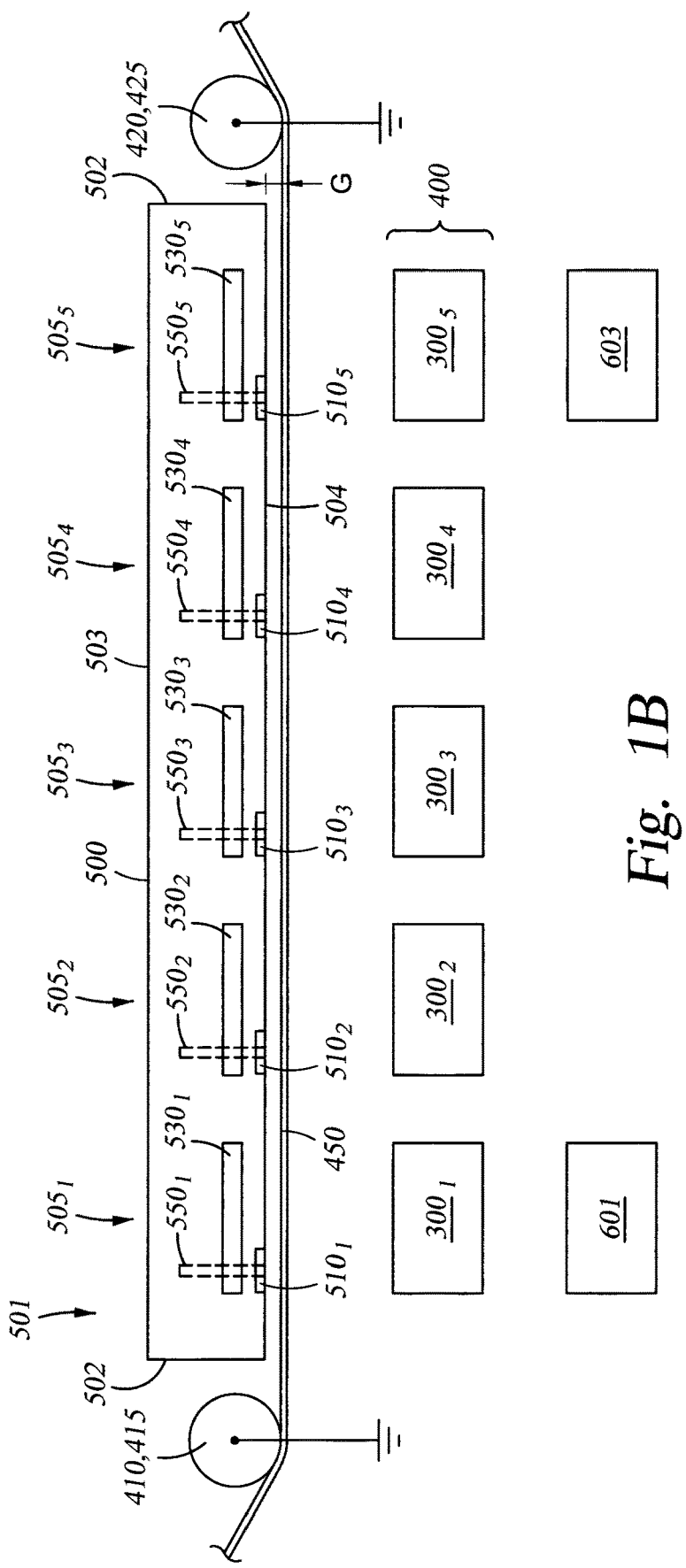
FIG. 1B is a side sectional view of the processing section of the deposition assembly of FIG. 1A showing additional detail of a first assembly in the processing section, according to one embodiment.

FIG. 1B is a side sectional view of the processing section 400 of the deposition assembly 11 showing additional detail of the first assembly 500, according to one embodiment. The first assembly 500 is used to chuck the flexible substrate 450 towards the first assembly 500 to improve the accuracy of the measurements of the composition and thickness of the material layer(s) deposited onto the flexible substrate 450, and in some embodiments to improve the consistency of the material layer(s) deposited onto the flexible substrate 450. The first assembly 500 may also be used to heat the flexible substrate 450 to a desired temperature during processing.

The first assembly 500 includes a body 501. The body 501 can include one or more walls 502, a top 503, and a base 504. The base 504 can be formed of a dielectric material (e.g., glass or ceramic material) that allows the electric field generated by electrically biasing the electrodes 510 (described below) to attract the flexible substrate 450 toward the first assembly 500. In some embodiments, the electrodes 510 may be embedded in the base 504, so that the electrodes 510 are directly exposed to the flexible substrate 450 without any portion of the base 504 disposed between the electrodes 510 and the flexible substrate 450. In some embodiments, the electric field from the electrodes 510 of the first assembly 500 can electrostatically attract the flexible substrate 450 to the outer surface of the base 504, so that the flexible substrate 450 contacts the base 504 at least at the locations of the electrodes 510. When the flexible substrate 450 is attracted to be against or a desired gap from the outer surface of the base 504, the position of the flexible substrate 450 in the Z-direction can be known with greater certainty, which can improve the accuracy of the measurements performed by the measurement device 550 described below.

The first assembly 500 is spaced apart from the five evaporation sources $300_1$-$300_5$ in the Z-direction (first direction). The first assembly 500 includes five process sets $505_1$-$505_5$. In some embodiments, as shown in FIG. 1B, each process set 505 is disposed above a corresponding evaporation source 300. In some embodiments, each process set 505 includes an electrode 510, a heater 530, and one or more measurement devices 550. In some embodiments, each process set 505 includes an electrode 510 and a heater 530, as is discussed further below.

Each electrode 510 can be used to electrostatically attract the flexible substrate 450 towards or against the base 504 of the first assembly 500, or in some embodiments directly towards an exposed electrode 510. Each electrode 510 can be placed directly over a corresponding evaporation source 300. Used herein, "directly over" refers to when an object is displaced from another object only in the Z-direction, so that the two objects share coordinates in the X and Y directions. Although the following description focuses on electrostatic chucking of any type of flexible substrate 450 towards or against the base 504, an electrostatic chucking design may also be used when a magnetizable flexible substrate 450 is used, such as flexible substrate 450 including a ferromagnetic material (e.g., 400 series stainless steels). Each electrode 510 can be independently controlled by the controller 601 so that different electrical properties (e.g., voltage) can be applied to the electrodes 510. For example, each electrode 510 can be electrically connected to a different switching device (not shown), such as a relay or contactor, so that a power supply 603 can energize that electrode 510. In some embodiments, the power supply 603 can apply a voltage from about 50 V DC to about 10,000 V DC, such as from about 500 V DC to about 4,500 V DC. Higher voltages can be applied to the electrodes 510 to attract the flexible substrate 450 closer to the base 504 of the first assembly 500 relative to when a lower voltage is applied to the electrodes 510. Furthermore, higher voltages can also be used when the weight, thickness, or stiffness of the flexible substrate 450 is increased by use of different substrate materials or due to the deposition of material on the substrate as it passes through the processing section 400.

Figure 2A:
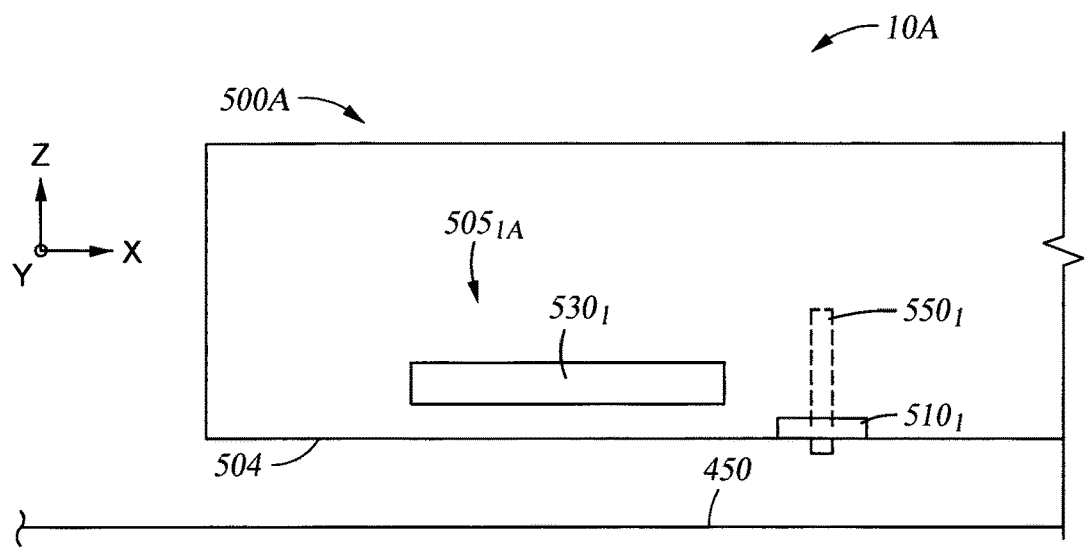
FIG. 2A is a partial side view of a deposition system including a first assembly, according to one embodiment.
Figure 2B:
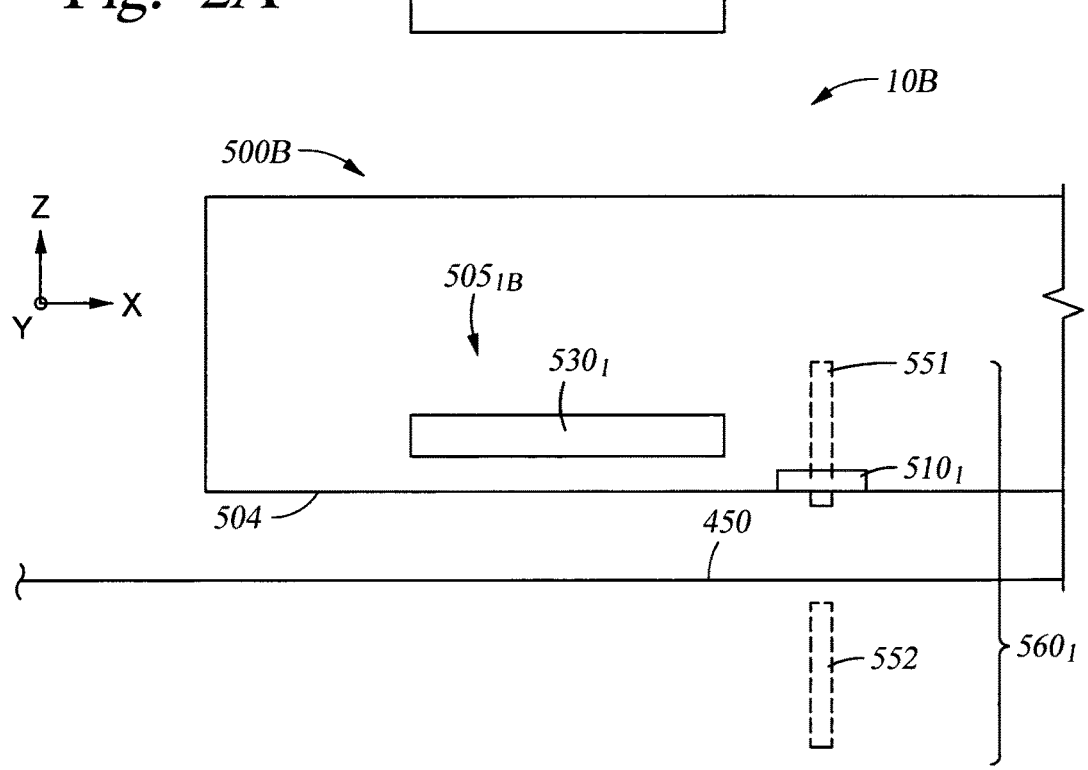
FIG. 2B is a partial side view of a deposition system including a first assembly, according to one embodiment.

Each heater 530 can be used to heat the flexible substrate 450 as the flexible substrate 450 passes over the respective evaporation source 300. The controller 601 can independently vary the power supplied to each heater 530, so that the heat generated by each heater 530 can be varied as needed. Each heater 530 can be disposed between the electrode 510 of that process set 505 and the top 503 of the first assembly 500. However, in some embodiments, the electrode 510 can be disposed between the heater 530 of that process set 505 and the top 503. Furthermore, in some embodiments, the electrode 510 and the heater 530 of a given process set may be disposed at locations not to overlie each other, for example, as shown in FIGS. 2A and 2B described below.

Each measurement device 550 can measure one or more properties, such as the composition and/or thickness of the material layer(s) deposited onto the flexible substrate 450. Although each process set 505 is shown including one measurement device 550 in FIG. 1B, each process set 505 can include multiple measurement devices 550, such as three measurement devices 550 as described below in reference to FIG. 1C. The measurements made by the measurement device 550 of a given process set 505 can be used to control the corresponding evaporation source 300 or heater 530 within that process set 505. For example, if the measured composition of the material deposited onto the flexible substrate 450 from a given evaporation source 300 is below a set point, then the heat applied to that evaporation source 300 can be raised to increase the flux of evaporated material from that evaporation source 300 towards the flexible substrate 450. However, in some embodiments, some process sets 505 in a series of process sets within the process section 400 may not contain a measurement device 550. In one example, as shown in FIG. 1B, the process sets $505_1$, $505_3$ and $505_4$ each do not contain a measurement device 550, while the process sets $505_2$ and $505_5$ each contain a measurement device 550. In this example, the measurement devices 550 in the process sets $505_2$ and process set $505_5$ may be used to control the corresponding evaporation source 300 or heater 530 in their process set and also other proximately positioned process sets (e.g., upstream and/or downstream process sets), such as the data collected from the measurement device 550 in process set $505_2$ may also be used to control the components in the process set $505_1$ and the data collected from the measurement device 550 in process set $505_5$ may also be used to control the components in the process sets $505_3$ and $505_4$.

However, when the distance between the flexible substrate 450 and the measurement device 550 of a given process set 505 varies in the Z-direction as the flexible substrate 450 is guided past the measurement device 550, for example due to a sagging flexible substrate 450, then the measurement device 550 can inaccurately measure and/or generate signals that indicate a changing composition and/or thickness even if the composition and/or thickness of deposited material layer is not changing. Thus, the electrode 510 of each process set 505 can be used to attract the flexible substrate 450 to a desired location in the Z-direction, so that the distance in the Z-direction between the measurement device 550 and the flexible substrate 450 remains constant as lengths of the flexible substrate 450 are guided past the measurement device 550 as the substrate 450 passes from the payout hub 110 to the pickup hub 210.

FIG. 10 is a bottom sectional view of the process set $505_1$ of FIG. 1B, according to one embodiment. In this embodiment, the base 504 can be clear material (e.g., glass), so that the process set $505_1$ disposed behind the base 504 is visible in the drawing. In some embodiments, the base 504 can be formed of a graphite window, which can be transparent to the X-rays detected by the measurement devices 550. In general, the base 504 can be formed of a material that is transparent for the detection method used by the measurement devices 550. However, in some embodiments, the measurement devices 550 can extend through a hole of the base 504, so that the base 504 does not interfere with the measurements performed by the measurement devices 550. The process set $505_1$ can be used to heat the flexible substrate 450 and to attract the flexible substrate 450 towards the base 504 of the first assembly 500 in the region directly above the first evaporation source $300_1$ (FIG. 1B). The process set $505_1$ includes an electrode $510_1$, a heater $530_1$, three measurement devices $550_{1A-1C}$, three position sensors $570_{1A-1C}$, and three temperature sensors $580_{1A-1C}$. Although FIG. 10 is described in reference to process set $505_1$, the description can also be applicable to the process sets $505_{2-5}$.

The electrode $510_1$ can be used to electrostatically attract the flexible substrate 450 towards or against the base 504 of the first assembly 500. In some embodiments, the electrode $510_1$ can be embedded in the base 504, so that the electrode $510_1$ is exposed to the flexible substrate 450. In such embodiments, the electrode $510_1$ may be coated with a ceramic material (e.g., a high temperature-resistant ceramic), so that electrical discharges between the electrode $510_1$ and other objects, such as the flexible substrate 450, may be prevented. Having the electrode $510_1$ exposed to the flexible substrate 450 can allow for the flexible substrate 450 to be more strongly attracted towards the electrode $510_1$ by the electrical field generated when the biasing voltage is applied to the electrode $510_1$.

Figure 1C:
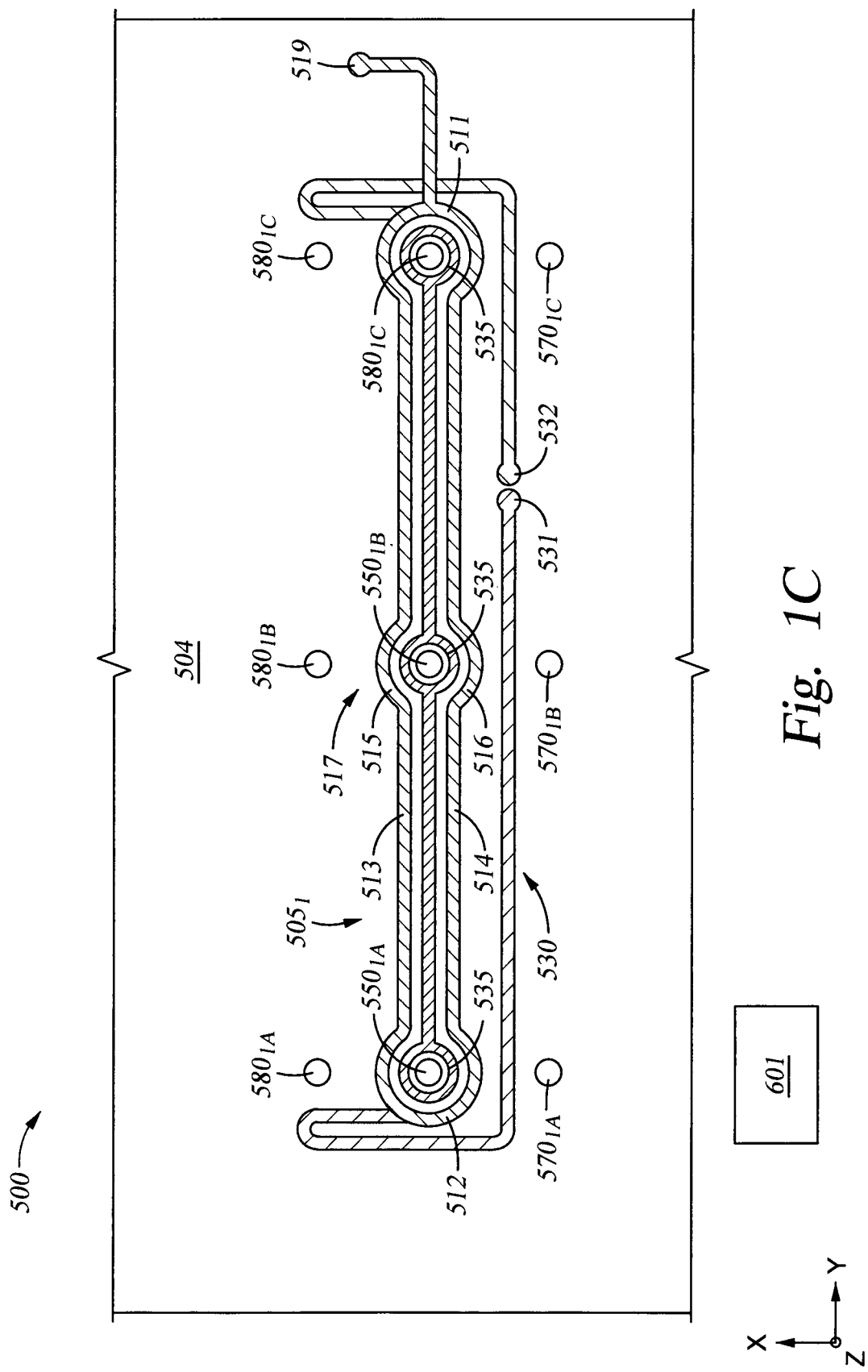
FIG. 1C is a bottom sectional view of a process set of FIG. 1B, according to one embodiment.

The electrode $510_1$ can include a terminal 519 through which the biasing voltage is provided to the electrode $510_1$ relative to a ground reference. The electrode $510_1$ further includes a first end 511, a second end 512, a first leg 513, and a second leg 514. The first leg 513 and the second leg 514 each extend in the Y-direction (third direction) from the first end 511 to the second end 512. The first leg 513 and the second leg 514 are spaced apart from each other in the X-direction (second direction), which in FIG. 1C is the direction in which the substrate travels. The first end 511 and the second end 512 each form a partial ring around respective measurement devices $550_{1C}$, $550_{1A}$. Furthermore, the first leg 513 includes a curved feature 515, and the second leg 514 includes a curved feature 516. The curved feature 515 and the curved feature 516 are disposed at the same location in the Y-direction to collectively form a partial ring 517 around the measurement device $550_{1B}$. These partial rings formed around each of the measurement devices 550 can ensure that a sufficiently strong electrical field is provided to attract the flexible substrate 450 towards the base 504 at the locations of these measurement devices 550, which can improve the accuracy of the composition and/or thickness measurement performed by these measurement devices 550.

In some embodiments, the electrode $510_1$ having a shape substantially in the form of a loop between the first end 511 and the second end 512 can be replaced with an electrode having a shape of a plate. In some embodiments, the electrode having the shape of a plate can be placed directly on the dielectric base 504, so that an electric field generated by the electrode can pass through a large surface area of the base 504. Furthermore, in some embodiments, the electrode having the shape of a plate can be embedded within the base 504, so that the electrode is exposed to the substrate 450. The electrode having a shape of a plate may still have holes through which the measurement devices 550 may extend to enable the measurement devices 550 to accurately measure the composition and/or thickness of the material layer(s) deposited onto the flexible substrate 450 without any obstruction by the base 504.

In the embodiment shown in FIG. 1C, a DC voltage can be applied to the electrode $510_1$, so that the electrode $510_1$ can function as a monopolar electrostatic chucking device. However, in some embodiments, a process set (e.g., process set $505_1$) may include two or more electrically isolated electrodes to which opposing DC voltages can be applied, so that the two or more electrically isolated electrodes can function as a bipolar electrostatic chucking device. Furthermore, as mentioned above, in some embodiments, an electrode in the process set can form part of a circuit through which current can flow to electromagnetically chuck a magnetizable substrate, such as a substrate including a ferromagnetic material. In some embodiments, in which an electromagnetic chuck is used the current and/or the frequency of an alternating current may be adjusted to modify the chucking force.

The heater $530_1$ can be used to heat and/or stabilize the temperature of the flexible substrate 450 and measurement environment that the measurement device 550 is exposed to as the flexible substrate 450 passes over the evaporation source $300_1$ (FIG. 1B). The heater $530_1$ can be a resistive heating cable through which electrical current can flow to generate the heat by a resistive heating method. The heater $530_1$ includes a first end 531 and a second 532. The electrical current can, for example, flow from a positive voltage source through the first end 531 and to the second end 532, which can be coupled to an electrical ground. The heater $530_1$ can include a plurality of rings 535. Each ring 535 can surround a corresponding measurement device 550 to ensure that heat is evenly distributed around the respective measurement devices 550 and so that the heat is homogeneously applied to the flexible substrate 450 below the respective measurement device 550.

Figure 1D:
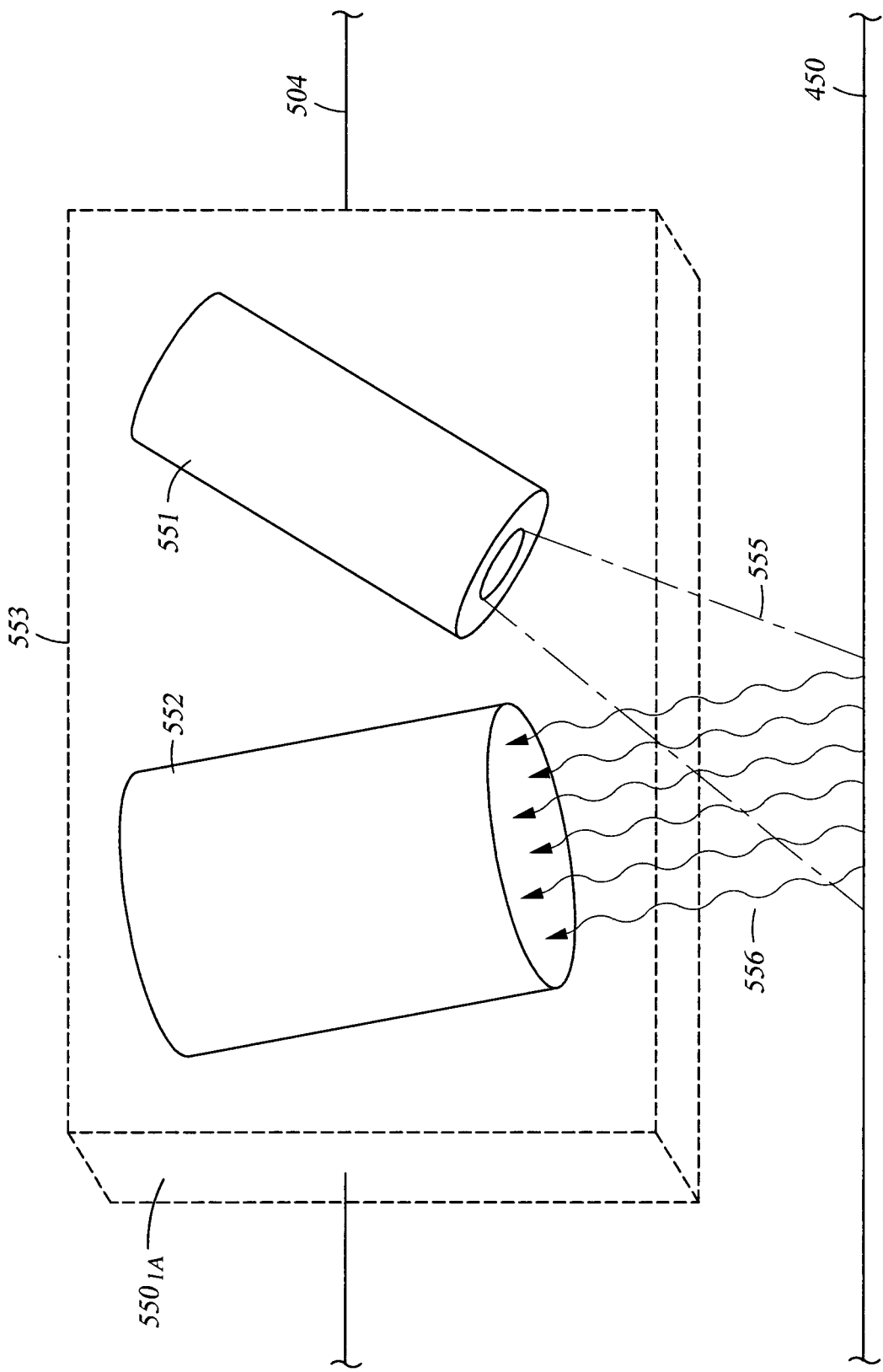
FIG. 1D is a side sectional view of one of the measurement devices in the process set of FIG. 1C, according to one embodiment.

The measurement devices 550 can be used to measure a property, such as composition and/or thickness, of the material layer(s) deposited onto the flexible substrate 450. For example, the measurement devices 550 can measure the percentage of one or more of the elements found in a CIGS layer that is formed of copper, indium, gallium, and/or selenium. In some embodiments, each measurement device 550 can be an X-ray fluorescence (XRF) measuring device. In other embodiments, the measurement devices 550 can be an optical measuring device. FIG. 1D below describes an exemplary XRF measuring device that can be used in the embodiments described herein. The process set $505_1$ can include three measurement devices 5501A-1C spaced apart from each other in the Y-direction. Although three measurement devices 5501A-1C are shown, other embodiments may include more or less measurement devices 550, and the measurement devices 550 may also be spaced apart in the X-direction as well as the Y-direction. Furthermore, in some embodiments one or more of the measurement devices 550 may be movable in the X-Y plane. The composition and/or thickness of the material layer(s) deposited on the flexible substrate 450 can often vary across the width of the flexible substrate 450 in the Y-direction (i.e., the direction perpendicular to the direction of travel of the substrate). Thus, the measurement devices 5501A-1C that are spaced apart in the Y-direction can be used to measure and correct for any variation in the Y-direction by adjusting the heat provided from heating elements that are distributed in the Y-direction within a corresponding evaporation source 300. For example, in some embodiments, the evaporation source $3001$ can include heaters that can selectively increase or reduce heat towards the edges of the evaporation source $3001$ in the Y-direction, so that the deposition rate across the width of the flexible substrate 450 becomes more uniform.

The position sensors 570 can be used to measure the position of the flexible substrate 450 in the Z-direction. The position sensors 570 were not shown in FIG. 1B in order to not clutter the drawing. The process set $505_1$ can include three position sensors $570_{1A-1C}$ spaced apart from each other in the Y-direction. Each position sensor 570 can be a non-contact position sensor, such as an optical position sensor, a capacitive position sensor, or an ultrasonic position sensor. In some embodiments, a contact position sensor may be used, such as a force sensor or a tactile sensor. The position of the flexible substrate 450 can often vary in the Z-direction across the width of the flexible substrate 450 in the Y-direction (i.e., the direction perpendicular to the direction of travel of the substrate). For example, a center of the flexible substrate 450 can sag lower in the Z-direction than the outer portions of the flexible substrate 450, which may be supported by clamps (see clamps 470 in FIG. 3A) or other supports. Thus, the three position sensors $570_{1A-1C}$ spaced apart from each other in the Y-direction can measure how the position in the Z-direction of the flexible substrate 450 varies in the Y-direction. Furthermore, the position of the flexible substrate 450 in the Z-direction can also vary at the same locations in the Y-direction as the flexible substrate 450 is guided past the flexible substrate 450. For example, in some embodiments, the flexible substrate may be supported at the edges in the Y-direction by clamps that are spaced apart in the X-direction. Because the clamps are spaced apart in the X-direction, the flexible substrate 450 can sag lower in the Z-direction at locations further from the clamps than at locations closer to the clamps.

The controller 601 can use measurements of the position sensors 570 to vary the voltage supplied to the electrode $510_1$ to place the flexible substrate 450 in a consistent position in the Z-direction across the width of the substrate 450 in the Y-direction as the flexible substrate 450 is guided past the evaporation source $300_1$ (FIG. 1B) in the X-direction. By placing the flexible substrate 450 in a consistent position in the Z-direction at the locations of the measurement devices 550, the accuracy of the composition and/or thickness measurements of the measurement devices 550 can be improved. When accurate composition and/or thickness measurements are made by the measurement devices 550, product quality can be improved because the controller 601 can modify outputs (e.g., heat provided to the evaporation source $300_1$) when modifications are actually needed instead of modifying outputs based on inaccurate measurements. Furthermore, by placing the flexible substrate 450 at a consistent position in the Z-direction at the location in the X-direction above the evaporation source $300_1$ (FIG. 1B), the consistency of the deposition can also be improved. For example, the process conditions (e.g., temperature and flux of evaporated material towards the substrate) in the deposition chamber 20 above the evaporation source $300_1$ can vary in the Z-direction, so any significant variance of the position in the Z-direction of the flexible substrate 450 can produce a corresponding variance of the deposition rate of evaporated material onto the surface of the flexible substrate 450. Thus, the position sensors 570 and the electrode $510_1$ can be used to place the flexible substrate 450 at a consistent position in the Z-direction when the flexible substrate 450 is above the evaporation source $300_1$, which removes a variable that can result in varying deposition rates on the surface of the flexible substrate 450.

In one embodiment, the controller 601 can average the three position measurements from the three position sensors $570_{1A-1C}$ and use the average to adjust the voltage supplied to the electrode $510_1$. For example, the average of the three position measurements can be the input to a proportional-integral-derivative (PID) control loop formed within software used by the controller 601, and the voltage can be the output of the PID control loop. In other embodiments, a different process set (i.e., different from the process set $505_1$ described above) may include an electrode for each position sensor 570, so that an individual control loop may be executed to independently control the position in the Z-direction of the flexible substrate 450 across the width of the flexible substrate 450 in the Y-direction.

Each temperature sensor $580_{1A-1C}$ can be used to measure the temperature of the flexible substrate 450 as the flexible substrate 450 passes above the evaporation source $300_1$ (FIG. 1B). Each temperature sensor 580 can be a non-contact temperature sensor, such as an infrared thermometer, a thermocouple, or a pyrometer. The temperature sensors 580 can be spaced apart from each other in the Y-direction. The controller 601 can use the measurements from the temperature sensors 580 to modify the power supplied to the heater $530_1$. In some embodiments, the process set (e.g., the process set $505_1$) can include a heater for each temperature sensor 570, so that the temperature of the different locations in the Y-direction of the flexible substrate 450 can be independently controlled, for example with an independent PID control loop for each temperature sensor and heater pair.

FIG. 1D is a side sectional view of one of the measurement devices 5501A in the process set $505_1$, according to one embodiment. The measurement device 5501A includes an X-ray source 551 and an X-ray detector 552 to determine the composition and thickness of the deposited material layer(s) on the flexible substrate 450. The X-ray source 551 may emit monochromatic or broadband X-ray radiation 555. The radiation 555 of the X-ray source 551 is used to excite atoms in all deposited layer(s) and atoms of the flexible substrate 450. The excited atoms relax by emitting fluorescent radiation 556 of discrete wavelengths. The discrete wavelengths emitted by the excited atoms can be analyzed by the measurement device 5501A to determine the composition and thickness of the deposited layer(s). In some embodiments, the measurement device 5501A can include two or more X-ray sources 551 for each X-ray detector 552. For example, in one embodiment the measurement device 5501A can include three X-ray sources 551 (e.g., an X-ray source for copper (Cu), an X-ray source for Gallium (Ga), and an X-ray source for Indium (In)) and a single X-ray detector 552.

The X-ray source 551 and the X-ray detector 552 can be placed in the same housing 553. The housing 553 is shown extending through the base 504 of the first assembly 500 or in some embodiments through an electrode 510 embedded within the base 504, so that the radiation emitted by X-ray source 551 and received by the X-ray detector 552 are not interfered with by the base 504. In embodiments in which the flexible substrate 450 is chucked against the outer surface of the base 504, the housing 553 may be flush with or recessed relative to the outer surface of the base 504, so that the measurement device 5501 does not contact the flexible substrate 450. In other embodiments (see FIG. 2B), the X-ray source 551 and the X-ray detector 552 may be placed in different housings. Furthermore, in some embodiments, the x-ray source 551 can be replaced with an electron source. An electron source can also excite atoms to emit fluorescent radiation that can be similarly detected by the X-ray detector 552 to determine the composition and thickness of the deposited layer(s).

Figure 1E:
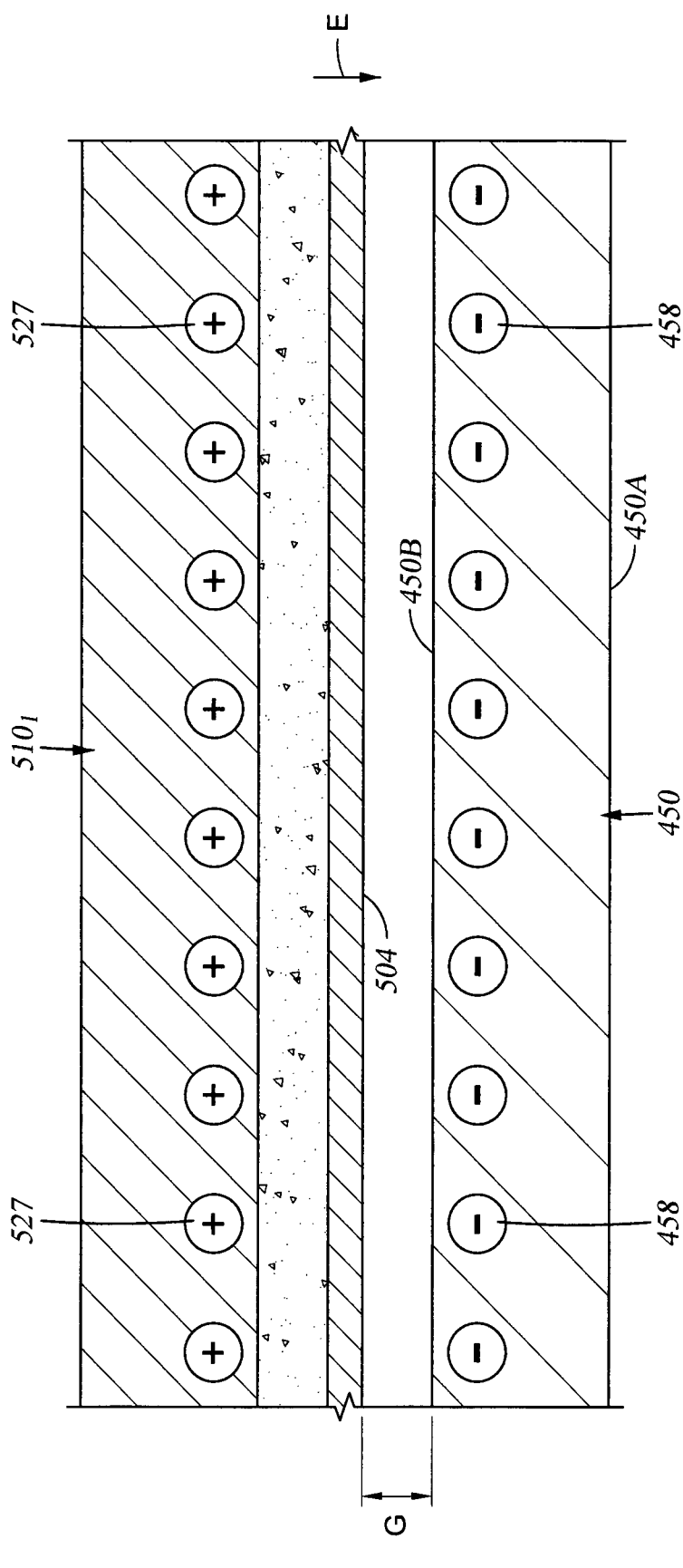
FIG. 1E is a partial side view of an electrode, a base 504, and a flexible substrate of the deposition system of FIG. 1A, according to one embodiment.

FIG. 1E is a partial side view of the electrode $510_1$, the base 504, and the flexible substrate 450 of the deposition system 10 of FIG. 1A, according to one embodiment. FIG. 1E illustrates a charge distribution across the electrode $510_1$ and the flexible substrate 450 when the electrode $510_1$ is biased with a positive voltage. The following description of FIG. 1E is also applicable when the electrode $510_1$ is embedded within the base 504, so that the electrode $510_1$ is exposed to the substrate 450. In such instances, the electrical field E created by the biased electrode $510_1$ can more directly attract the substrate 450 relative to when electric filed E polarizes the base 504 to attract the substrate 450 towards the base 504.

When the controller 601 energizes the electrode $510_1$ with a positive voltage, a positive charge 527 accumulates on the electrode $510_1$. When the positive voltage is applied to the electrode $510_1$, an electric field E develops between the electrode $510_1$ and the flexible substrate 450. It is believed that the base 504 formed of the dielectric material (e.g., glass) may polarize so that a positive charge accumulates on the surface of the base 504 facing the flexible substrate 450. The flexible substrate 450 can also become polarized due to the generated bias, so that an opposing charge can migrate through the flexible substrate 450 in response to the generated electric field E. In this example, the electric field E created by the positive bias of the electrode $510_1$ attracts negative charges 458 to the back side 450B of the flexible substrate 450 while positive charges 457 are repelled by the generated electric field E towards the front side 450A. The accumulation of positive charge 517 at the electrode $510_1$ and negative charge 458 at the back side 450B of the flexible substrate 450 attracts the flexible substrate 450 towards the base 504. The magnitude of the positive voltage applied to the electrode $510_1$ can be increased to attract the flexible substrate 450 closer to the base 504 or to be against the base 504.

It is generally desirable to assure that a gap G (FIG. 1B) is formed between the back side 450B of the flexible substrate 450 and the lower surface of the base 504, by the substrate 450 guiding elements (e.g., payout tractors 410, 415 and pickup tractors 420, 425). The gap G can be less than about 20 millimeters (mm), such as less than about 10 millimeters (mm). In another example, the gap G can be between about zero millimeters and 20 mm, such as between about 0.1 mm and 10 mm. By assuring that the gap G is within a desirable range of distances one can make sure that the flexible substrate 450 will be "chucked" as the substrate processing and substrate tensioning variables drift over time.

In some embodiments, the flexible substrate 450 can be electrically coupled to an electrical ground of the circuit which applies the bias voltage to the electrode $510_1$, so that the flexible substrate 450 is not electrically floating, and is electrically referenced with respect to the electrode $510_1$. Furthermore, in some embodiments, a negative voltage may be applied to the electrode $510_1$, so that a negative charge accumulates on the electrode $510_1$ and a positive charge accumulates on the back side 450B of the flexible substrate 450 to attract the flexible substrate 450 towards the base 504.

FIG. 2A is a partial side view of a deposition system 10A including a first assembly 500A, according to one embodiment. The first assembly 500A is similar to the first assembly 500 described above except that the first assembly 500A includes process sets (e.g., process set $505_{1A}$) which are different from the process sets (e.g., process set $505_1$) described above. The process set $505_{1A}$ shown here includes the electrode $510_1$, the heater $530_1$, and the measurement device $550_1$ like the process set $505_1$ described above and shown in FIG. 1B. However, the electrode $510_1$ and the measurement device $550_1$ are disposed at a location other than directly above the evaporation source $300_1$. For example, in this embodiment the electrode $510_1$ and the measurement device $550_1$ are disposed at a location in the X-direction after the evaporation source $300_1$. Thus, the electrode $510_1$ and the measurement device $550_1$ may be disposed between the first evaporation source $300_1$ and the second evaporation source $300_2$ (see FIG. 1B) in the X-direction. Disposing the electrode $510_1$ and the measurement device $550_1$ at a position in the X-direction after the flexible substrate 450 passes the evaporation source $300_1$ allows the measurement device $550_1$ to measure the composition and/or thickness of a more completed deposition. Furthermore, the electrode $510_1$ can be energized, so that the flexible substrate 450 is in a consistent position in the Z-direction, so that the accuracy of the composition and/or thickness measurement made by the measurement device $550_1$ can be improved. In the embodiment shown, the measurement device $550_1$ and the electrode $510_1$ are disposed on the back side 450B of the flexible substrate 450. However, in other embodiments, one or more of the measurement devices $550_1$ and the electrode $510_1$ can be disposed on the front side 450A of the flexible substrate 450. Furthermore, in some embodiments, the heater $530_1$ may also be disposed on the front side 450A of the flexible substrate 450, so that in some embodiments the components in each process set 505 are all disposed on the front side 450A of the flexible substrate 450.

FIG. 2B is a partial side view of a deposition system 10B including a first assembly 500B, according to one embodiment. The first assembly 500B is similar to the first assembly 500A described above except that the first assembly 500B includes process sets (e.g., process set 5051B), which are different from the process sets (e.g., process set 5051A) described above. The process set 5051B shown here includes the electrode 5101 and the heater 5301 like the process set 5051A described above and shown in FIG. 2A. However, the process set 5051B includes a measurement device 5601 instead of the measurement device 5501. The measurement device 5601 places the X-ray source 551 and the X-ray detector 552 on different sides of the flexible substrate 450. Placing the X-ray source 551 and the X-ray detector 552 on different sides of the flexible substrate 450 can help prevent the radiation emitted by the X-ray source 551 from interfering with the radiation received by the X-ray detector 552. In the embodiment shown, the X-ray source 551 is disposed on the back side 450B of the flexible substrate 450 and the X-ray detector 552 is disposed on the front side 450A of the flexible substrate 450. However, in other embodiments, the X-ray source 551 can be disposed on the front side 450A of the flexible substrate 450 and the X-ray detector 552 can be disposed on the back side 450B of the flexible substrate 450.

Figure 3A:
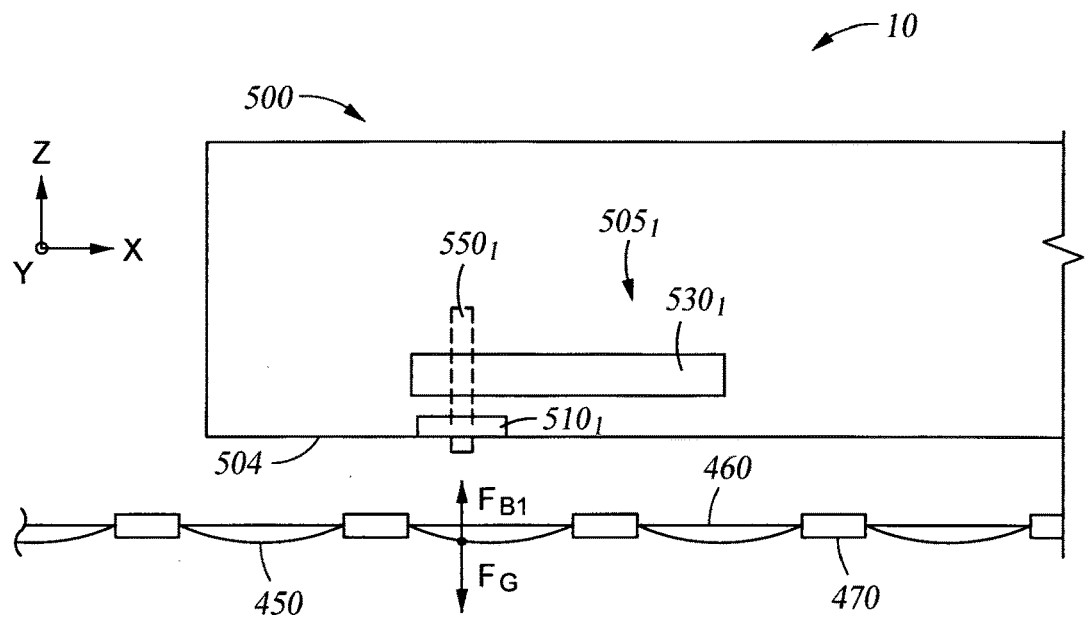
FIG. 3A is a partial side view of the deposition system of FIG. 1A when a first biasing voltage is applied to the electrode, according to one embodiment.

FIG. 3A is a partial side view of the deposition system 10 when a first biasing voltage is applied to the electrode $510_1$, according to one embodiment. The view in FIG. 3A shows the flexible substrate 450 being guided past the evaporation source $300_1$ using a plurality of clamps 470 that are supported by a rail 460. The clamps 470 can slide along the rail 460 to provide vertical support for portions of the flexible substrate in the Z-direction. Despite the use of the clamps 470, the flexible substrate 450 will still sag in the Z-direction between the clamps 470 due to its inherent weight. In cases where the electrode 510 is biased with a voltage (e.g., voltage between 0 Volts and $V_{b1}$ Volts) that only produces a biasing force $F_{B1}$ that is created by the formed electric field that is insufficient to overcome the gravitational force $F_G$ created by the weight of the flexible substrate 450 and inherent mechanical stiffness of the flexible substrate 450, the substrate may not be able to be "chucked" and/or will only be moved to an unknown position relative to the base 504.

Figure 3B:
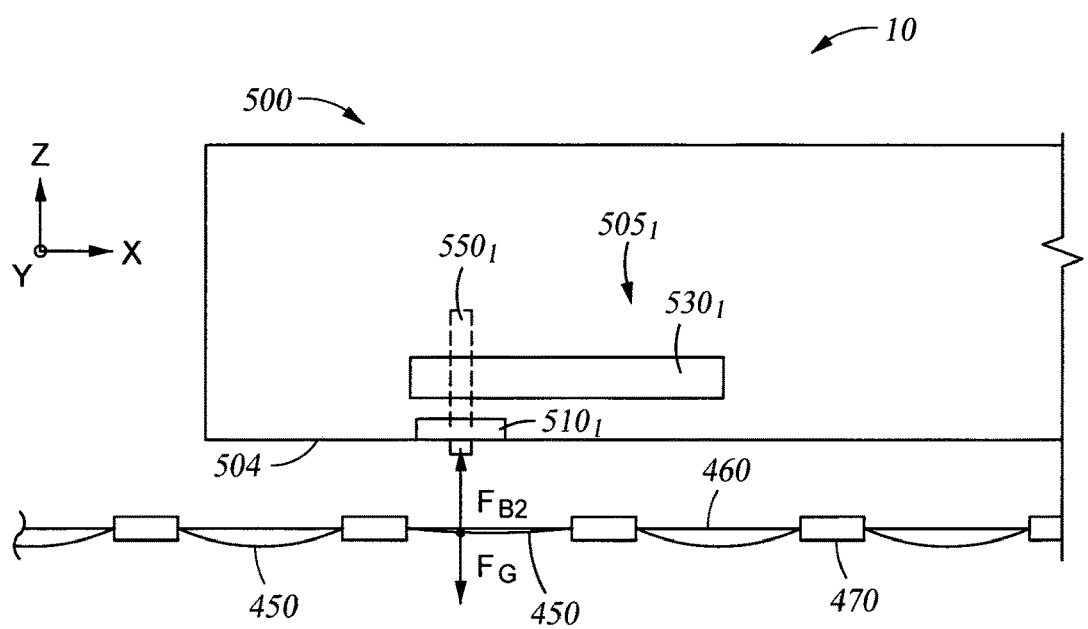
FIG. 3B is a partial side view of the deposition system of FIG. 1A when a second biasing voltage is applied to the electrode, according to one embodiment.

FIG. 3B is a partial side view of the deposition system 10 when a second biasing voltage (e.g., $V_{b2}$ Volts) is applied to the electrode $510_1$, according to one embodiment. The second biasing voltage is greater in magnitude than the first biasing voltage (e.g., $V_{b2} > V_{b1}$). The second biasing voltage produces a biasing force $F_{B2}$ that is sufficient to overcome the gravitational force $F_G$ to attract the flexible substrate 450 to a position closer to the base 504, such as a position in the Z-direction substantially even with the rail 460. Because the flexible substrate 450 is attracted to a position in the Z-direction that is even with the rail 460, the flexible substrate 450 directly below the measurement device $550_1$ is at a consistent position in the Z-direction, which improves the accuracy of the composition and/or thickness measurements performed by the measurement device $550_1$. The improved accuracy of the composition and/or thickness measurements can enable the controller 601, to more appropriately respond to changes in composition and/or thickness measurements, which can improve product quality. In some embodiments, the second biasing voltage produces a biasing force $F_{B2}$ that causes the flexible substrate 450 to be positioned at a distance equal to a desired measurement gap that is measured in the Z-direction relative to the base 504. In some configurations, the measurement gap, which is created by the application of the bias and the positioning of the substrate 450 provided by the substrate guiding elements (e.g., payout tractors and pickup tractors), may be between about zero micrometers and 20 millimeters (mm), such as between about 0.1 μm and 3 millimeters (mm).

Figure 4:
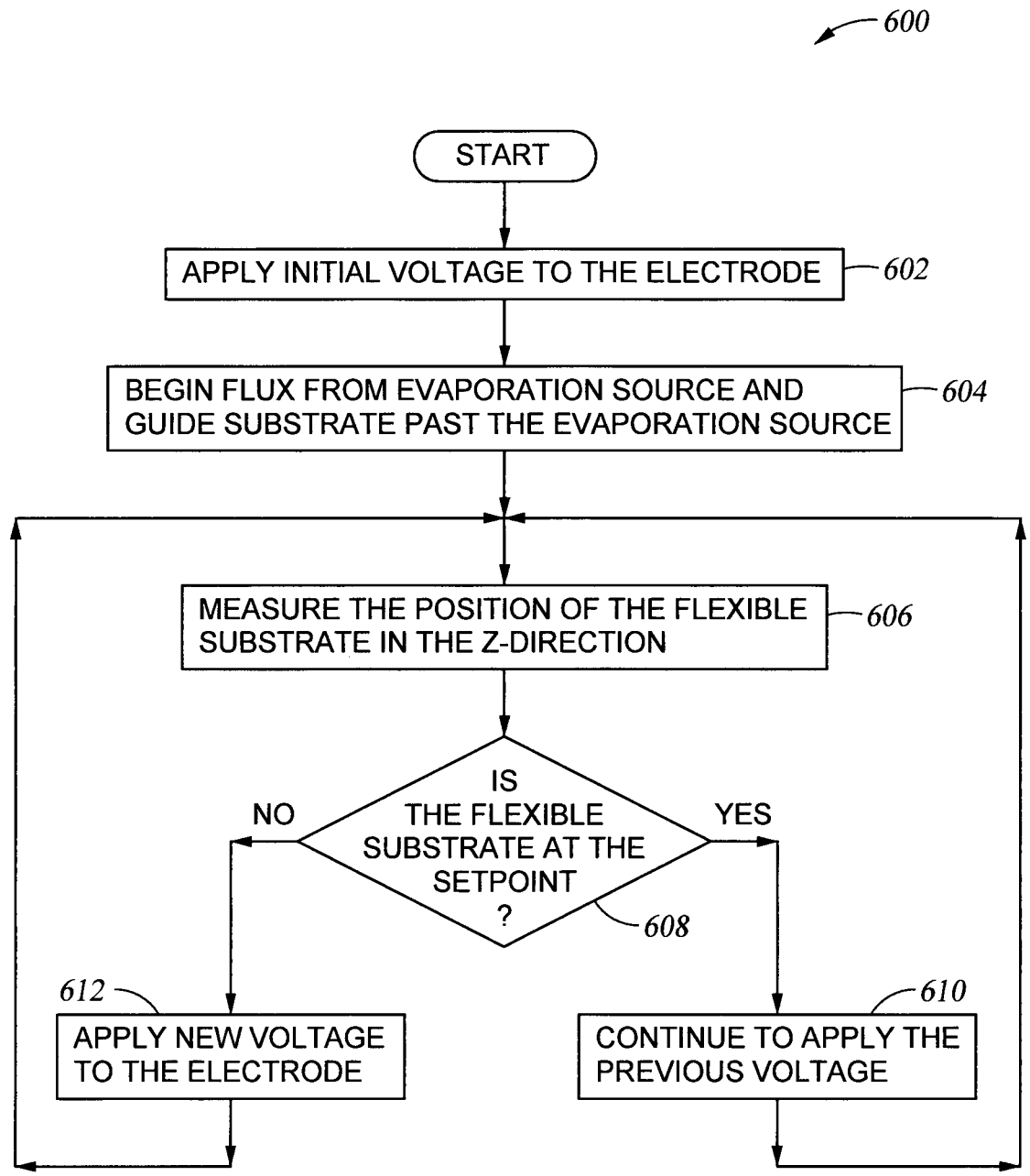
FIG. 4 is a process flow diagram of a method for depositing a material layer onto the substrate, according to one embodiment.

FIG. 4 is a process flow diagram of a method 600 for depositing a material layer onto the substrate 450, according to one embodiment. Referring to FIGS. 1B and 1C, the method 600 is described. At block 602, an initial bias voltage is applied to the electrode $510_1$. At block 604, the evaporation source $300_1$ is activated to direct a flux of material towards the substrate 450 and the substrate 450 is guided past the evaporation source $300_1$. At block 606, the position of the flexible substrate 450 in the Z-direction directly above the evaporation source $300_1$ is measured. At block 608, the position of the flexible substrate 450 in the Z-direction is compared to a setpoint for the position of the flexible substrate 450 in the Z-direction. At block 610, if the flexible substrate 450 is located at a position in the Z-direction that corresponds with the setpoint, then the previously applied voltage to the electrode $510_1$ is maintained. At block 612, when there is a difference between the position in the Z-direction of the flexible substrate 450 and the setpoint, then a new voltage is applied to the electrode $510_1$ in order to decrease the difference between the measured position of the flexible substrate in the Z-direction and the setpoint. For example, the magnitude of the voltage applied to the electrode $510_1$ may be increased if the flexible substrate 450 is lower in the Z-direction than a desired position of the flexible substrate 450. After the execution of either block 610 or 612, the process loops around to repeatedly execute blocks 606, 608, and either 610 or 612, so that the voltage applied to the electrode $510_1$ can either be adjusted or maintained in order to adjust the position of the flexible substrate 450 to be closer to or at the set point.

In some embodiments, the bias voltage that is applied to the electrodes 510 positioned in each of the successive process sets 505, which are serially distributed along the processing section 400, may be increased due to the need to compensate for the increased thickness and stiffness of the substrate as material is deposited on the surface of the substrate 450. In some embodiments, the bias voltage that is applied to the electrodes 510 in each of the process sets 505, which are serially distributed along the processing section 400, may be separately adjusted based on a need to compensate for changes in the stiffness of the substrate 450 due to temperature fluctuations or other material structural related effects seen within or on the substrate 450 within different areas of the processing section 400.

While the foregoing is directed to embodiments of the present disclosure, other and further embodiments of the disclosure may be devised without departing from the basic scope thereof, and the scope thereof is determined by the claims that follow.

What is claimed is:

1. A deposition system for guiding a flexible substrate along a deposition path, the deposition system comprising:
a payout hub for unwinding the flexible substrate;
a pickup hub for winding the flexible substrate;
one or more evaporation sources; and
one or more electrodes spaced apart from the one or more evaporation sources in a first direction, wherein
the one or more evaporation sources comprises at least two evaporation sources that are spaced apart from each other in a second direction, and
wherein
each of the one or more electrodes has a first leg and a second leg that are spaced apart in the second direction, and extend in a third direction that is perpendicular to the first direction and the second direction, and
the one or more electrodes comprise a first electrode, and one or more measurement devices, wherein
a first measurement device of the one or more measurement devices is disposed between the first leg and the second leg of the first electrode; and
a controller configured to adjust one or more voltages provided to the one more electrodes.

2. The deposition system of claim 1, further comprising one or more sensors configured to measure a position of the flexible substrate in the first direction, wherein the controller is configured to adjust the one or more voltages provided to the one more electrodes based on the one or more measurements of the one or more sensors.

3. The deposition system of claim 1, wherein the one or more measurement devices comprises a first measurement device, and the first measurement device is disposed directly over the first evaporation source.

4. The deposition system of claim 1, further comprising a first heater, wherein the first electrode is disposed between the first heater and the first evaporation source in the first direction.

5. The deposition system of claim 1, further comprising one or more sensors configured to measure a position of the flexible substrate in the first direction, wherein
the one or more measurement devices are spaced apart from each other in the third direction,
the one or more sensors are spaced apart from each other in the third direction, and
each measurement device is aligned with one of the sensors in the third direction.

6. The deposition system of claim 1, further comprising a dielectric base disposed between the one or more electrodes and the one or more evaporation sources.

7. The deposition system of claim 1, wherein the first electrode is disposed between the first evaporation source and the second evaporation source.

8. The deposition system of claim 1, wherein
the measurement device comprises an X-ray detector and an X-ray source,
the X-ray detector is positioned to be on a first side of the flexible substrate, and
the X-ray source is positioned to be on a second side of the flexible substrate.

9. The deposition system of claim 1, wherein the measurement device comprises an X-ray detector.

10. A deposition system for guiding a flexible substrate along a deposition path, comprising:
a plurality of evaporation sources, wherein the plurality of evaporation sources comprises a first evaporation source and a second evaporation source;
a first assembly comprising one or more process sets disposed over the plurality of evaporation sources, wherein the one or more process sets comprises:
one or more electrodes, wherein
the one or more electrodes include a first electrode configured to electrostatically attract a portion of a flexible substrate towards a surface of the first assembly, and the first electrode comprises a first leg and a second leg that are spaced apart from each other in a first direction, and extend in a second direction that is perpendicular to the first direction;

a heater; and one or more position sensors that are configured to detect a position of the portion of the flexible substrate relative to the one or more position sensors, wherein the detected position of the portion of the flexible substrate is in a third direction that extends from the surface of the first assembly towards the plurality of evaporation sources;

one or more measurement devices, wherein the one or more measurement devices include a first measurement device disposed between the first leg and the second leg of the first electrode; and a controller configured to adjust one or more voltages provided to the one or more electrodes based on the detected position of the flexible substrate by the one or more position sensors.

11. The deposition system of claim 10, wherein the one or more measurement devices are configured to measure a thickness or composition of a layer deposited of a surface of the portion of the flexible substrate by at least one of the plurality of evaporation sources.

12. The deposition system of claim 11, wherein the one or more measurement devices comprises a first measurement device, the first measurement device is disposed directly over a first evaporation source, and the first measurement device comprises an X-ray detector.

13. The deposition system of claim 10, further comprising a payout tractor and a pickup tractor that are each configured to contact a surface of the portion of the flexible substrate, wherein the payout tractor and the pickup tractor are grounded.

14. A deposition system for guiding a flexible substrate along a deposition path, the deposition system comprising:

a first assembly comprising a plurality of process sets, wherein each of the plurality of process sets comprise:

one or more electrodes, wherein the one or more electrodes are configured to electrostatically attract a portion of a flexible substrate towards a surface of the first assembly in a first direction, the one of more electrodes include a first electrode having a first leg and a second leg that are spaced apart in a second direction and extend in a third direction perpendicular to the first direction and the second direction;

a heater; and one or more evaporation sources spaced apart in the second direction;

one or more measurement devices, wherein the one or more measurement devices include a first measurement device disposed between the first leg and the second leg of the first electrode; and a computer readable medium having instructions stored thereon which when executed by a processor causes the following method to be performed:

applying a voltage to the electrode;

measuring a position of the flexible substrate in the first direction; and adjusting the voltage based on the measured position of the flexible substrate in the first direction.

* * * * *

UNITED STATES PATENT AND TRADEMARK OFFICE
CERTIFICATE OF CORRECTION

| | |
|---|---|
| PATENT NO. | : 11,499,221 B2 |
| APPLICATION NO. | : 16/325350 |
| DATED | : November 15, 2022 |
| INVENTOR(S) | : Bernhard Schlaeppi and Michael Akermann |

It is certified that error appears in the above-identified patent and that said Letters Patent is hereby corrected as shown below:

On the Title Page

Item (71), Remove second Applicant Lorenzo Parrini

Signed and Sealed this
Twenty-fourth Day of January, 2023

Katherine Kelly Vidal
*Director of the United States Patent and Trademark Office*